United States Patent [19]

Sommargren et al.

[11] Patent Number: 5,022,061
[45] Date of Patent: Jun. 4, 1991

[54] AN IMAGE FOCUSING MEANS BY USING AN OPAQUE OBJECT TO DIFFRACT X-RAYS

[75] Inventors: Gary E. Sommargren, Santa Cruz; H. Joseph Weaver, Livermore, both of Calif.

[73] Assignee: The United States of America as represented by the United States Department of Energy, Washington, D.C.

[21] Appl. No.: 516,401

[22] Filed: Apr. 30, 1990

[51] Int. Cl.$^5$ .......................... G21K 1/06; G21K 7/00
[52] U.S. Cl. .......................................... 378/84; 378/43
[58] Field of Search .................... 378/84, 70, 43, 34, 378/35

[56] References Cited

U.S. PATENT DOCUMENTS

| | | | |
|---|---|---|---|
| 1,626,306 | 4/1927 | St. John | 378/84 |
| 2,735,018 | 2/1956 | McLachlan, Jr. | 378/84 |
| 4,203,032 | 5/1980 | Haunstetter et al. | 250/205 |
| 4,426,719 | 1/1984 | Wang | 378/99 |
| 4,429,411 | 1/1984 | Smither | 378/84 |
| 4,692,938 | 9/1987 | Oba | 378/62 |
| 4,870,674 | 9/1989 | Schmahl et al. | 378/43 |
| 4,887,282 | 12/1989 | Mueller | 378/34 |
| 4,891,830 | 1/1990 | Iwahashi | 378/35 |

Primary Examiner—Edward P. Westin
Assistant Examiner—Kim-Kwok Chu
Attorney, Agent, or Firm—Michael Lee; L. E. Carnahan; William R. Moser

[57] ABSTRACT

The invention provides a method and apparatus for focusing and imaging x-rays. An opaque sphere is used as a diffractive imaging element to diffract x-rays from an object so that the divergent x-ray wavefronts are transformed into convergent wavefronts and are brought to focus to form an image of the object with a large depth of field.

29 Claims, 6 Drawing Sheets

AN IMAGE FOCUSING MEANS BY USING AN OPAQUE OBJECT TO DIFFRACT X-RAYS

The United States Government has rights in this invention pursuant to Contract No. W-7405-ENG-48 between the U.S. Department of Energy and the University of California, for the operation of Lawrence Livermore National Laboratory.

BACKGROUND OF THE INVENTION

The invention relates to a method and apparatus for focusing and imaging x-rays. More particularly, the invention relates to extremely high resolution imagery such as that required for high density micro-lithography.

Methods of focusing x-rays and imaging x-ray sources or objects illuminated with x-rays are quite different from focusing and imaging visible light. Because the refractive index of materials is very close to unity at x-ray wavelengths, refractive lenses are not possible as with visible light.

Curved mirrors, used at grazing incidence to the x-rays, are currently used to focus x-rays; however these mirrors are costly to fabricate because of their non-spherical topography. These mirrors are also difficult to align. By depositing multi-layer structures to curved mirrors they can be made to operate at normal incidence, but to achieve high resolution imaging the surfaces must be extremely smooth, on the order of the wavelength of the x-rays. In addition, these mirrors are made for a specific wavelength of light and imaging configurations, limiting the uses of these mirrors. Also, mirror imaging systems have a short depth of field. This means that the image is in focus at a discrete location, and if the image plane is slightly moved from the location where the image is in focus, the image would be out of focus.

Fresnel zone plates are used to image x-rays by diffraction. A Fresnel zone plate looks like a very small bull's eye pattern with alternating opaque and transmissive rings. The separation of the outer most rings determines the imaging resolution, the resolution being approximately equal to 1.22 times the separation of the outer most rings. Zone plates are fabricated using photolithography or micro-machining techniques. The inability of these techniques to construct Fresnel zone plates to a desired tolerance severely limits the ultimate resolution that can be obtained. To provide an image with a resolution of 700 angstroms, a zone plate would need the outer most rings to be spaced approximately 575 angstroms apart. In addition, zone plates have a short depth of field. Zone plates are also limited with respect to imaging objects that are off axis with respect to the zone plate. The further away an object is from the axis the more out of focus the image for that object becomes.

The diffraction of visible light by an opaque sphere was first demonstrated by Arago in 1818. The distribution of light in an observation plane was derived by Mie in 1908 using rigorous electromagnetic theory. The resultant formulas, however, are quite involved and cannot easily be used to study the characteristics of diffraction pattern. Some authors have tried to described the pattern using scalar diffraction theory. Most have concentrated on the axial intensity of the central bright spot, with Osterberg and Smith solving the Rayleigh diffraction integral exactly. In 1914 Hufford realized that this diffraction phenomenon could also be used to form an image. He demonstrated this using a carbon arc lamp, but never pursued the problem analytically nor with non-visible radiation. Since then, this phenomenon has received little attention, since for visible imaging applications other high quality lenses and mirrors are readily available.

SUMMARY OF THE INVENTION

It is an object of the invention to provide an x-ray imaging system using diffraction.

It is another object of the invention to provide an x-ray imaging system with an inexpensive diffractive element.

It is another object of the invention to provide an x-ray imaging system with an easy to manufacture and easy to align diffractive element.

It is another object of the invention to provide an x-ray imaging system with that can image a spectrum of x-ray wavelengths.

It is another object of the invention to provide a high resolution x-ray imaging system.

It is another object of the invention to provide an x-ray imaging system with a large depth of field.

It is another object of the invention to provide an x-ray imaging system that does not require a monochromatic x-ray source and can provide imaging at various frequencies.

It is another object of the invention to provide an x-ray imaging system that can image off axis objects.

It is another object of the invention to provide an x-ray lithography system using diffraction, wherein the diffractive element is inexpensive and easy to align.

It is another object of the invention to provide a method and apparatus for making high resolution x-ray lithography or optical lithography masks.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

The present invention provides a simple method and apparatus for focusing and imaging x-rays. Like the zone plate it is based on diffraction. An opaque sphere is used to diffract x-rays from an object such that the divergent x-ray wavefronts are transformed into convergent wavefronts and are brought to focus to form an image of the object. Although this technique has been used to image visible light, it has not been used for imaging x-rays. Furthermore, it has not been used in the specific application of x-ray lithography or the production of lithographic masks.

DESCRIPTION OF THE PREFERRED EMBODIMENTS

Figure 1:
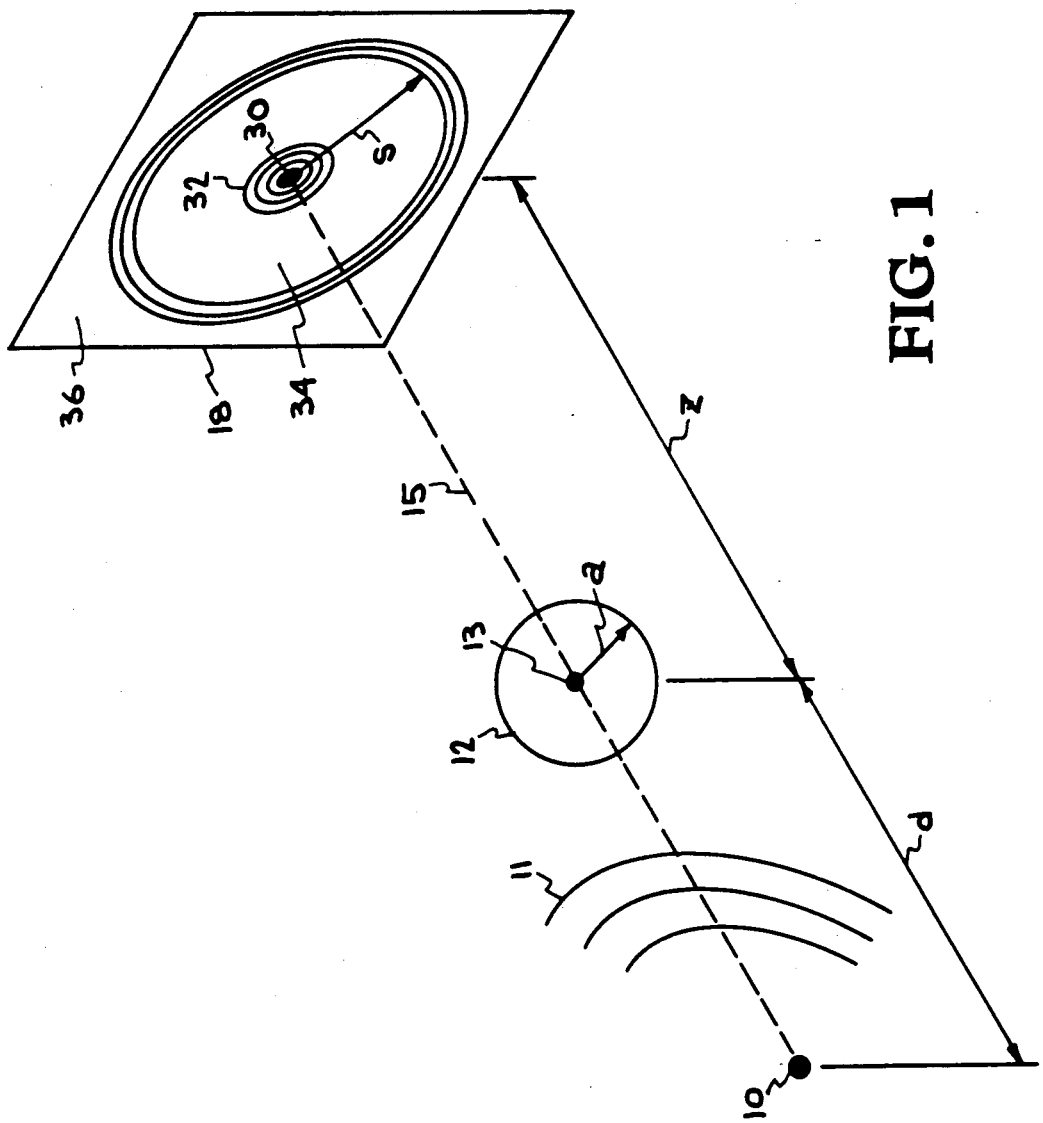
FIG. 1—depicts in schematic form a preferred embodiment of the invention with a point source of x-rays.

FIG. 1 depicts in schematic form the general diffraction of an x-ray wave by a preferred embodiment of the invention. A point source 10 emits a wave 11 of wavelength λ which propagates a distance d to the right and is incident on an opaque sphere 12 of radius a. Due to the interaction of the wave 11 and the opaque sphere 12, the wave 11 is altered as and after it passes the opaque sphere 12. This phenomenon is known as diffraction. The intensity of the diffracted wave can be observed on an observation screen 18 placed any distance z behind the opaque sphere 12. The intensity pattern on the observation screen 18 has two distinct regions: a directly illuminated region 36 and a shadow region 34. Due to diffraction, the shadow region 34 has a small high intensity spot 30 surrounded by lower intensity diffraction rings 32. The high intensity spot 30 falls on an axial line 15 (shown as a dotted line) defined by the point source 10 and the center 13 of the opaque sphere 12. As illustrated in FIG. 1, d is the distance between the source 10 and the center 13 of the opaque sphere 12, z is the distance between the center 13 of the opaque sphere 12 and the center of the high intensity spot 30, and s is the radial coordinate measured from the center of the high intensity spot 30 on the observation screen 18. The intensity in the shadow region 34 is given by:

$$I(s,d) = (1/(z+d)^2)(V_0(u,v)^2 + V_1(u,v)^2),$$

and the intensity in the directly illuminated region 36 is given by:

$$I(s,z) = (1/(z+d)^2)(1 + U_1(u,v)^2 + U_2(u,v)^2$$
$$- 2U_1(u,v) \sin((u^2+v^2)/2u) + 2U_2(u,v) \cos((u^2+v^2)/2u)),$$

where:

$$v = kas/z, \quad u = ka^2((z+d)/zd), \quad k = 2\pi/\lambda,$$

and $V_0(u,v)$, $V_1(u,v)$, $U_1(u,v)$, and $U_2(u,v)$ are Lommel functions. Lommel functions are mathematical functions, which are useful for describing the diffraction of spherical waves. Lommel functions are further described by Born and Wolf in "Principles of Optics," published by Pergamon Press 1965, pp. 435–439 incorporated by reference.

Figure 2:
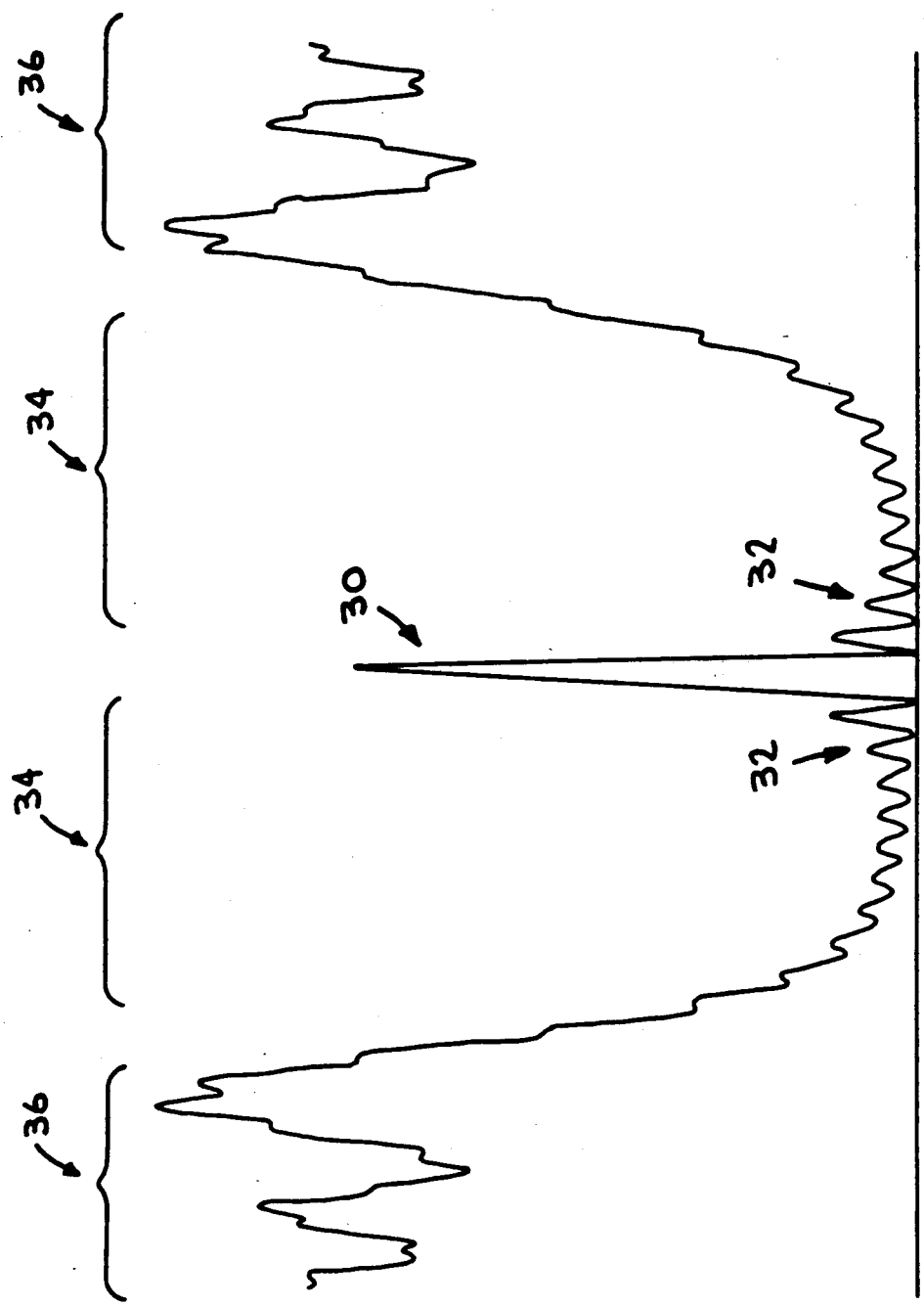
FIG. 2—depicts in schematic form the intensity of the diffracted wave on an observation screen in the preferred embodiment of the invention illustrated in FIG. 1 as a function of distance along the screen.

FIG. 2 depicts in schematic form the radial coordinate s, where s equals zero at the small high intensity spot 30, versus the intensity of the diffracted wave on the observation screen 18, showing the small high intensity spot 30, the surrounding lower intensity diffraction rings 32, the shadow region 34, and the directly illuminated region 36.

Figure 3:
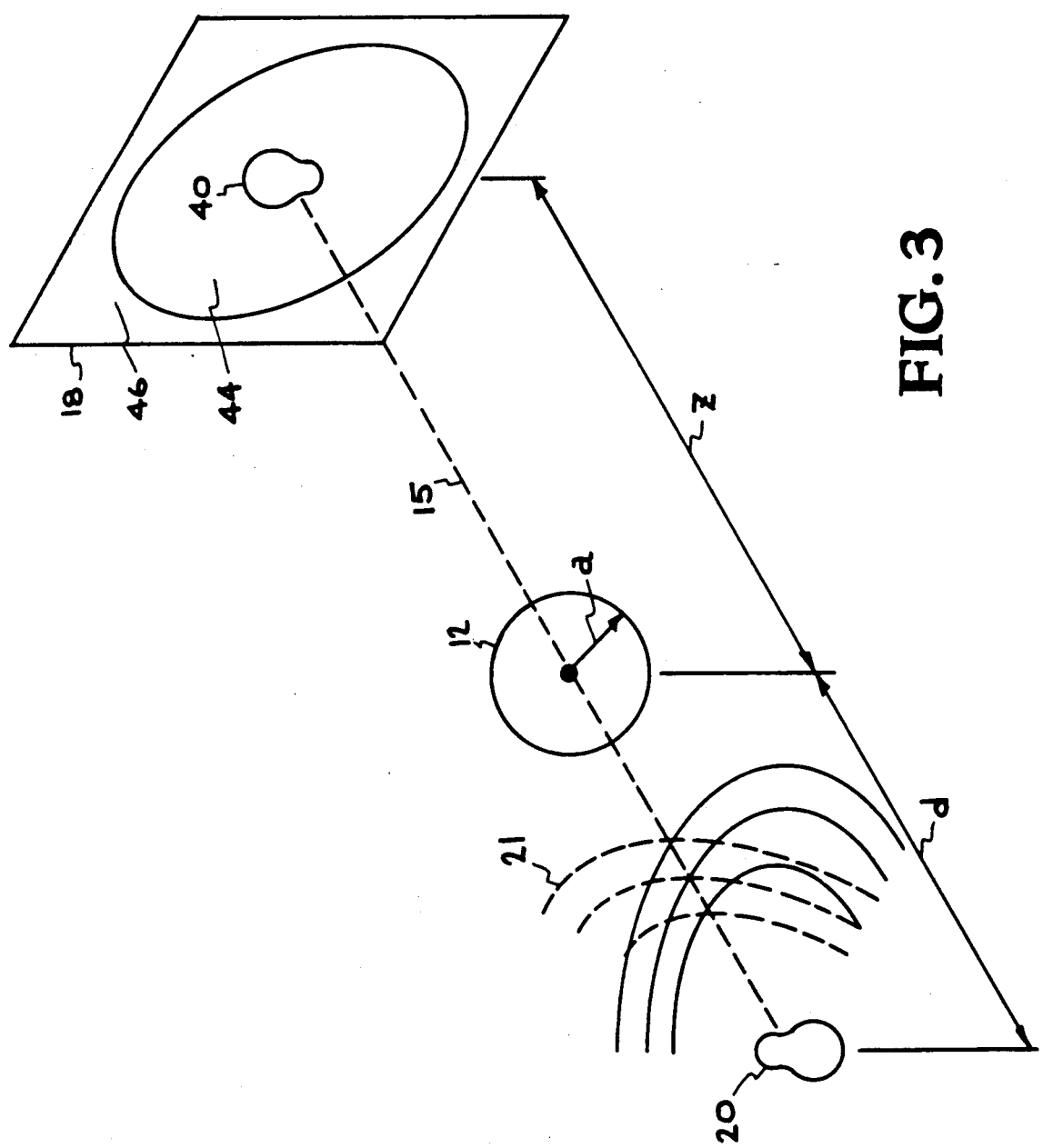
FIG. 3—depicts in schematic form the general imaging of an extended source of x-rays by the preferred embodiment of the invention illustrated in FIG. 1.

FIG. 3 depicts in schematic form the general imaging, by the preferred embodiment of the invention illustrated in FIG. 1, of an extended source 20 which either emits or transmits x-rays. An extended source 20 may be considered an ensemble of point sources, each one behaving as described in FIG. 1. The extended source 20 emits a collection of waves 21 of wavelength λ which propagate to the right and are incident on the opaque sphere 12 of radius a. As previously described in detail, each component wave in the collection of waves 21 is diffracted by the opaque sphere 12 to form an illuminated region 46. The ensemble of small high intensity spots 40 collectively resemble the extended object 20. The resolution of such a configuration is approximately equal to 0.381λ/a. Since the resolution of the image 40 is proportional to the wavelength of the x-rays which is much shorter than the wavelength of visible light, the resolution of the image will be much higher than the resolution of a configuration using visible light. The magnification (or demagnification) m of the image 40 relative to the extended object 20 is m=z/d.

The principle advantages of the instant invention are: (1) x-rays can be focused or imaged by a very simple, inexpensive and easily fabricated device, an opaque sphere; (2) the image can be either magnified or demagnified depending on the placement of the sphere between the object and observation screen; (3) the resolution can easily be increased by either using a shorter x-ray wave-length or a larger opaque sphere; (4) the ultimate resolution is orders of magnitude better than that using conventional methods; (5) there are no out of focus off axis images, since the symmetry of the sphere makes each object point act as if it was on the image axis allowing for easy alignment of the object and the diffractive imaging element; and (6) a large depth of field allows the image screen to be placed at many possible distances from the diffractive imaging element allowing a large range of desired magnifications or reductions and preventing the image from being out of focus.

In this preferred embodiment of the invention, an opaque sphere with a diameter of 10 mm (a=5 mm) is used to image an extended x-ray source where the wavelength of the x-rays are 20 angstroms. The distance z from the sphere to the observation plane, which is a piece of photographic film, is 250 mm. The resolution of such a configuration is approximately 400 Angstroms. Although there is no theoretical limit as to the range of wavelengths that could be used, practical considerations would suggest that the range of wavelengths be between 0.5 angstroms and 9000 angstroms. Similarly, practical considerations would suggest that the diameter of the opaque sphere be between 0.01 mm and 40 mm.

Another possible shape for the diffractive imaging element for a single point source would be a round plate aligned so that an axial line from the point source to the center of the round plate would be perpendicular to the surface of the round plate. What is important is that an opaque object be used as a diffractive imaging element which provides a circular cross-section such that the diameter of the circular cross-section is substantially perpendicular to a line from the point source to the center of the circular cross-section. The circular cross-section should provide a solid opaque cross-section without apertures so that the diffractive imaging element provides a circular shadow region caused by the circular cross-section. Other cross-sectional shapes may distort the high intensity central spot. For imaging an extended source, to prevent loss of resolution, the diffractive imaging element should be shaped so that a line from each extended point source to the center of the diffractive imaging element should be perpendicular to a substantially circular cross-section of the diffractive imaging element. This would require that the diffractive imaging element is a spheric section, which is defined here as being a sphere or part of a sphere which includes an entire cross-section of a sphere wherein the cross-section passes through the center of the sphere.

Figure 4:
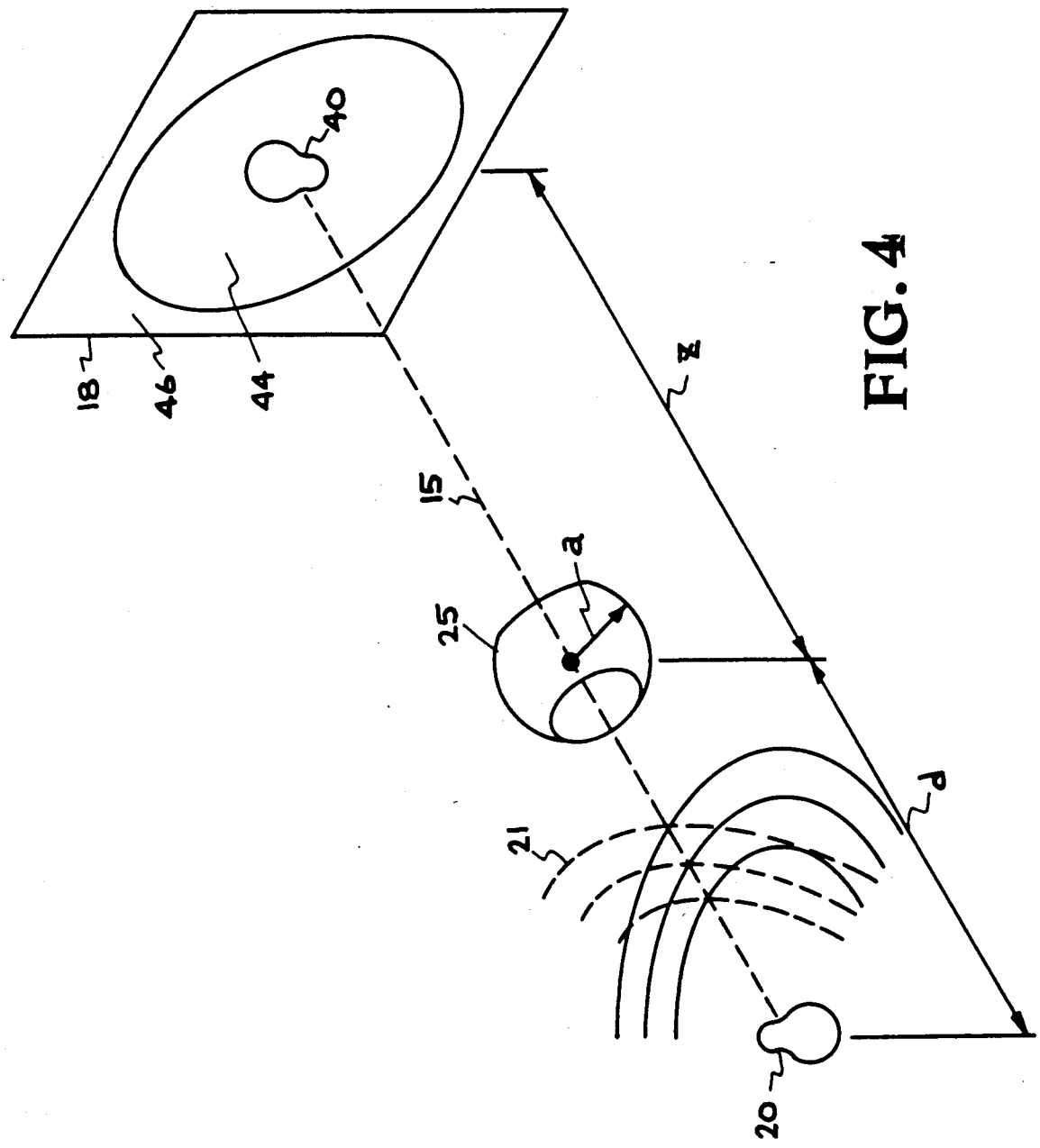
FIG. 4—depicts in schematic form the general imaging of an extended source of FIG. 3 using a spheric section.

FIG. 4 is an illustration of an embodiment like FIG. 3. The only difference between the embodiment in FIG. 4 is that instead of using a spheric section that is a whole sphere as in FIG. 3, the embodiment in FIG. 4 uses a spheric section 25 that is part of a sphere. The center of a spheric section is defined for the specification and claims as the center of the sphere if the spheric section were a whole sphere.

A whole sphere is preferred because spheres can be made easily with high accuracy.

Various types of screens could be used in the preferred embodiment according to the application of the invention. In diagnostics the screen could be photographic film or a charged coupled device. Here it may be desirable to magnify the image. By placing the extended x-ray source 25 mm from the sphere and the film or camera 250 mm from the sphere as described above the resulting image would be magnified by a factor of 10. If the invention is to be used for x-ray lithography, the screen may be a layer of photoresist on an integrated circuit chip. Here it may be desirable to reduce the image. By placing the extended x-ray source, which may be a mask with apertures through which an x-ray beam is projected, a distance of 2500 mm from the sphere, a reduction in the image by a factor of 10 results with a resolution of approximately 400 Angstroms.

Figure 5:
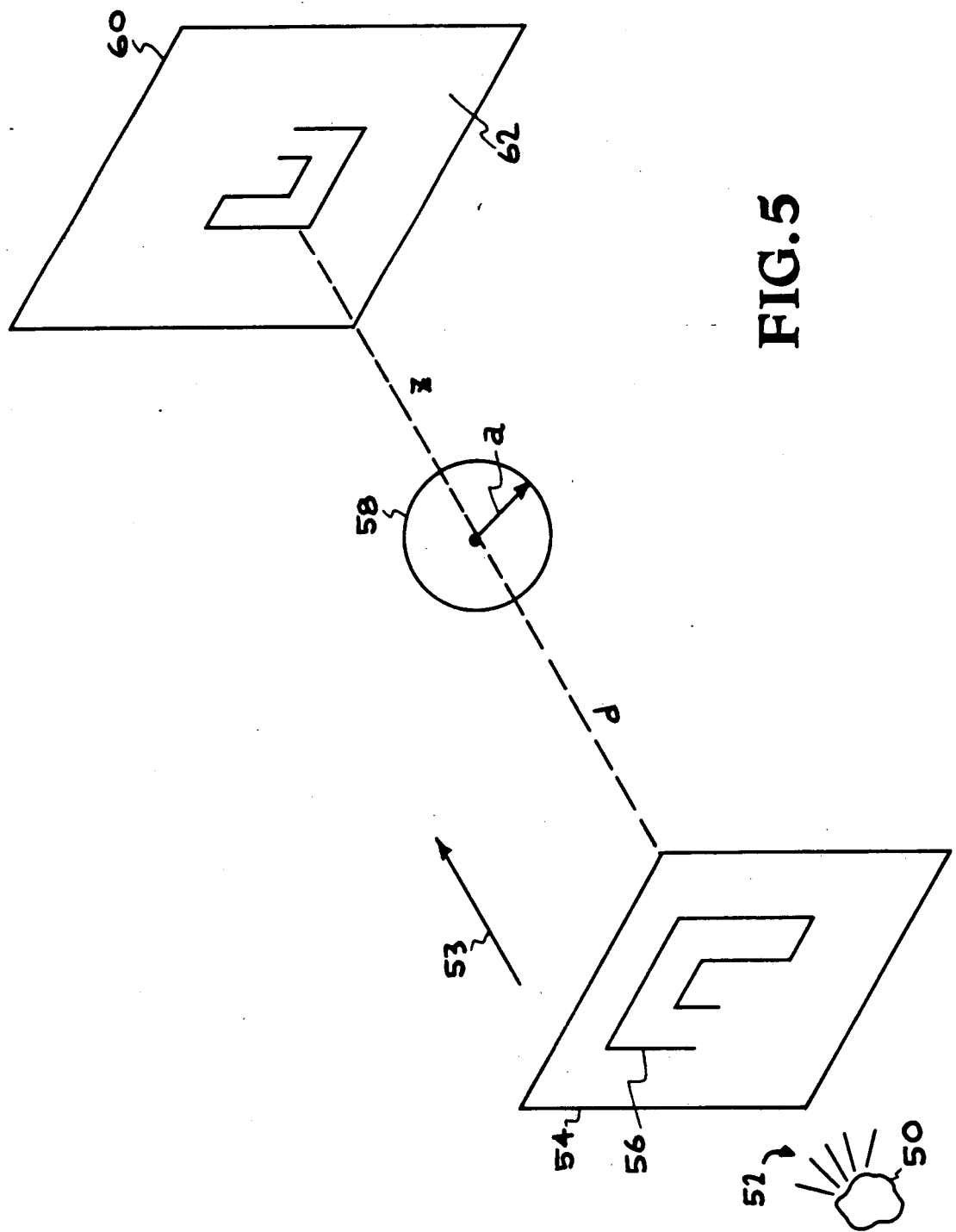
FIG. 5—depicts in schematic form x-ray lithography using a preferred embodiment of the invention.

FIG. 5 illustrates another preferred embodiment of the invention. In FIG. 5, a source of x-rays 50 is used to emit x-rays 52. A mask 54 is placed in a first direction 53 from the source of x-rays 52. The mask 54 has at least one aperture 56. An opaque sphere 58 is placed along the first direction 53 from the mask 54. A semiconductor wafer 60 is place on the opposite side of the opaque sphere 58 from the mask 54 along the first direction 53 from the opaque sphere 58. The semiconductor wafer 60 has a surface which faces the opaque sphere 58. The surface of the semiconductor wafer 60 facing the opaque sphere 58 is covered with a layer of photoresist 62.

In the specification and claims, when the location of objects is described, these directions and locations are used in an x-ray optical or electron beam optical sense. For example, in the above paragraph when the opaque sphere 58 is said to be placed in a first direction 53 from the mask 54 it means along an x-ray optical path. So if a grazing incident mirror were added to bend the path of the x-rays between the opaque sphere 58 and the mask 54, then the opaque sphere 58 and the semiconductor wafer 60 must be moved to be aligned with the new x-ray geometry and the first direction 53 would trace out a bent path. In addition, the axial line would now be bent following the new x-ray path. When the photoresist is described as being on a surface that faces the opaque sphere it is again described as along an x-ray optical path. In the subsequent embodiment where an electron beam is described, then the first direction designates along the trajectory of the electron beam.

Some of the x-rays 52 from the x-ray source 50 travel in the first direction to the mask 54. Some of the x-rays 52 are attenuated by the opaque sections of the mask 54 while other x-rays are transmitted through the apertures 56 in the mask. The x-rays 52 that pass through the apertures 56 are diffracted by the opaque sphere 58. The x-rays diffracted by the opaque sphere 58 form an image on the layer of photoresist 62. The photoresist can be etched away to create the same pattern as the apertures 56 of the mask 54. As previously mentioned, the pattern formed by the apertures 56 of the mask 54 can be reduced when formed on the semiconductor wafer 60 by making the distance between the mask 54 and the opaque sphere 58 greater than the distance between the semiconductor wafer 60 and the opaque sphere 58.

Figure 6:
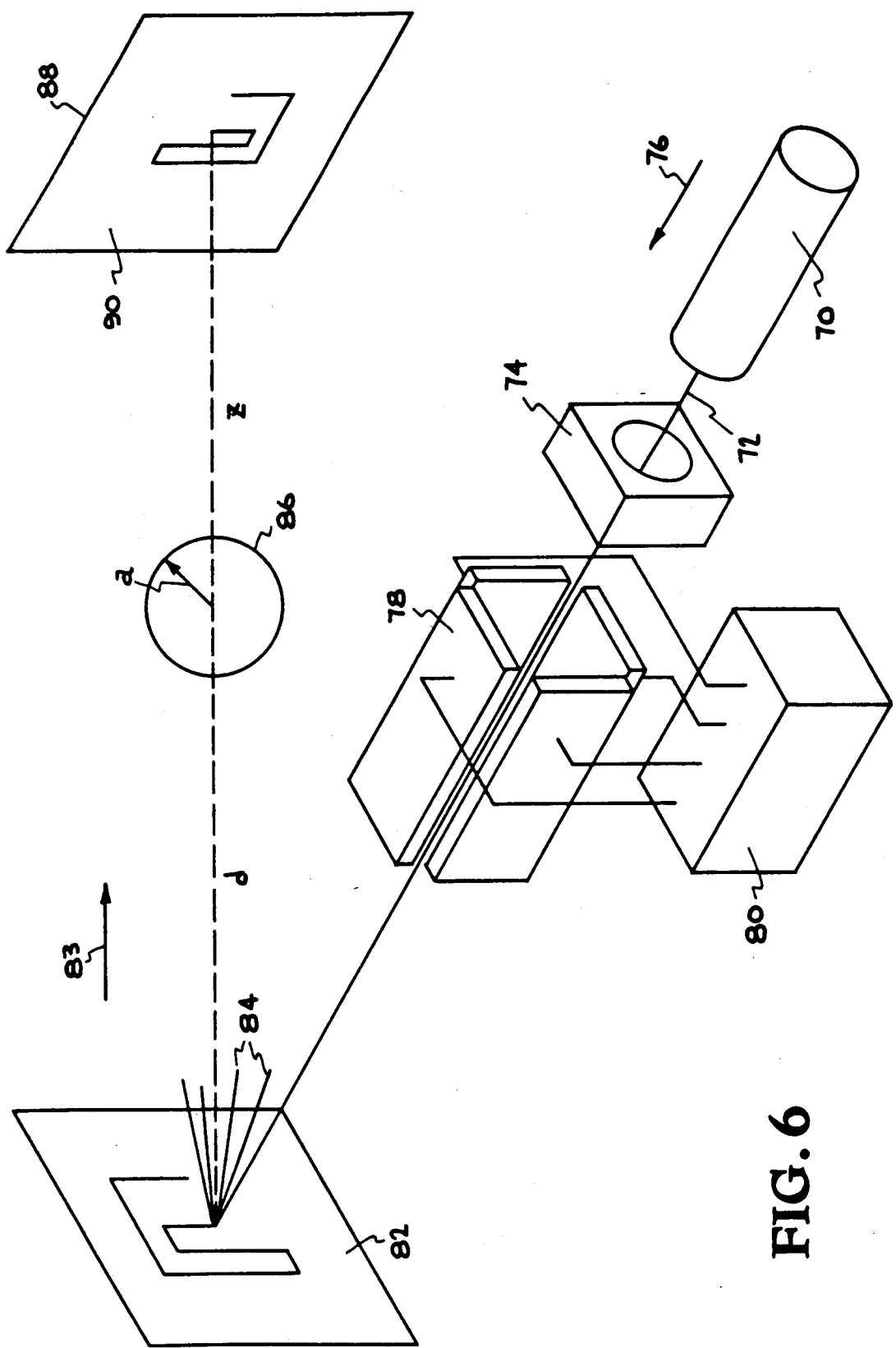
FIG. 6—depicts in schematic form the production of a mask using a preferred embodiment of the invention.

FIG. 6 illustrates another preferred embodiment of the invention useful for creating lithography masks. FIG. 6 illustrates an electron source 70, which generates an electron beam 72 in a first direction 76. An electron lens 74 is located along the first direction 76 from the electron beam. A set of deflection plates 78 electrically connected to a pattern generator 80 is along the first direction 76 from the electron lens. A target 82 is located along the first direction 76 from the deflector plates 78. An opaque sphere 86 is located along a second direction 83 from the target 82. A substrate 88 is located along the second direction 83 from the opaque sphere 86. The substrate 88 has a surface facing the opaque sphere 86. The surface of the substrate 88 facing the opaque sphere is covered with a layer of photoresist 90.

The electron source 70 generates an electron beam 72 in the first direction 76, which passes through an electron lens 74 which focuses the electron beam 72. From the electron lens 74 the electron beam 72 passes through a set of deflector plates 78 which are charged plates which cause the electron beam to scan in a desired pattern, which would be the pattern of an aperture for a desired mask. The charge on the deflection plates is controlled by the pattern generator 80. After passing through the deflector plates 78, the electron beam 72 impinges on the target 82. The deflector plates 78 cause the electron beam 72 to scan across the target 82 in a specified pattern. X-rays 84 are emitted from the location of where the electron beam 72 impinges on the target 82. As the electron beam 72 traces a pattern on the target, a pattern of x-ray 84 point sources is generated. The x-rays 84 are diffracted by the opaque sphere 86 to form an image pattern on the photoresist surface 90. The photoresist surface 90 can be etched away for form a mask with an aperture in the shape of the desired pattern.

The foregoing description of preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus for imaging x-rays, comprising:
    an extended x-ray source which comprises a plurality of x-ray point sources which emit or transmit x-rays;
    a diffractive imaging element having an opaque spheric section which has a solid opaque circular cross section which is perpendicular to an axial line which extends through the x-rays source and the opaque spheric section and wherein the diffractive imaging element creates a circular shadow, the center of which contains an image of the extended x-ray source with a large depth of field, and wherein the extended source is on a first side of the diffractive imaging element; and a screen, on which an image of the extended x-ray source is formed, located on a second side of the diffractive imaging element opposite to the first side of the diffractive imaging element, and wherein the screen is located along the axial line.

2. An apparatus as claimed in claim 1, wherein diameter of the circular cross-section of the opaque spheric section has a diameter between 0.01 mm and 40 mm.

3. An apparatus as claimed in claim 2, wherein the opaque spheric section is an opaque sphere with a center, wherein the center of the sphere lies on the axial line.

4. An apparatus as claimed in claim 3, wherein the screen is photographic film with a photographic surface that faces the diffractive imaging element and is perpendicular to the axial line.

5. An apparatus as claimed in claim 3, wherein the screen is a surface of a charged couple device camera, and wherein the surface is facing the diffractive imaging element and is perpendicular to the axial line.

6. A method for imaging x-rays, comprising:
propagating the x-rays from an extended x-ray source;
diffracting the x-rays around a diffractive object to create an image of the extended x-ray source with a large depth of field, wherein an axial line extends through the extended x-ray source and the diffractive imaging element, and wherein the diffractive object has an opaque spheric section which has a solid circular cross-section which is perpendicular to the axial line and wherein the extended x-ray source is on a first side of the diffractive imaging element; and
placing a screen in the path of the diffracted x-rays on a second side of the diffractive object along the axial line.

7. A method as claimed in claim 6, wherein the diameter of the circular cross-section of the diffractive imaging element has a diameter between 0.01 mm and 40 mm.

8. A method as claimed in claim 7, wherein the opaque spheric section is an opaque sphere.

9. An apparatus for x-ray lithography, comprising:
an x-ray source which provides x-rays in a substantially first direction;
a mask which is opaque to x-rays with apertures which are transparent to x-rays, wherein the mask is placed along the first direction with respect to the x-ray source;
a diffractive imaging element having an opaque spheric section which has a solid circular cross-section which is perpendicular to an axial line which extends through the mask and the opaque spheric section and wherein the diffractive imaging element creates a circular shadow, the center of which contains an image of the extended x-ray source with a large depth of field, and wherein the diffractive imaging element is placed along the first direction with respect to the x-ray source and the mask; and
a semiconductor wafer, on which an image of the mask is formed, placed along the first direction with respect to the x-ray source, the mask, and the diffractive imaging element and along the axial line.

10. An apparatus as claimed in claim 9, wherein the diameter of the circular cross section of the opaque spheric section is between 0.01 mm and 40 mm.

11. An apparatus as claimed in claim 10, wherein the opaque spheric section is an opaque sphere with a center, wherein the center of the sphere lies on the axial line.

12. An apparatus as claimed in claim 11, wherein the semiconductor wafer has a surface facing the diffracting element and wherein the surface is covered with a layer of photoresist material.

13. An apparatus as claimed in claim 12, wherein the distance between the diffractive imaging element and the semiconductor wafer is less than the distance between the mask and the diffractive imaging element and wherein the surface covered with photoresist is perpendicular to the axial line.

14. A method for accomplishing x-ray lithography, comprising the steps of:
propagating x-rays in a first direction;
placing a mask along the x-rays, wherein the mask has opaque areas which attenuate some of the x-rays and apertures which transmit some of the x-rays;
diffracting the x-rays around a diffracting means to provide an image with a large depth of field said means being placed along the first direction with respect to the mask;
placing a semiconductor wafer along the first direction with respect to the diffracting means.

15. A method as claimed in claim 14, wherein the diffracting is accomplished by an opaque spheric section that has a solid circular cross-section which is perpendicular to an axial line that extends through the mask and the center of the opaque spheric section.

16. A method as claimed in claim 15, wherein the diameter of the spheric section is between 0.01 mm and 40 mm.

17. A method as claimed in claim 16, wherein the opaque spheric section is an opaque sphere.

18. A method as claimed in claim 17, further comprising the steps of:
applying a layer of photoresist to a surface of the semiconductor wafer facing the diffracting means; and
chemically etching the layer of photoresist.

19. A method as claimed in claim 18, wherein the distance between the semiconductor wafer and the diffractive means is less than the distance between the mask and the diffractive means and wherein the semiconductor wafer is placed so that the surface on which the layer of photoresist is applied is perpendicular to the axial line.

20. An apparatus for making a lithographic mask, comprising:
means for generating an electron beam in a first direction;
means for deflecting the electron beam located along the first direction from the means for generating the electron beam;
a target of a material which emits x-rays when impinged by an electron beam, located along the first direction from the deflecting means;
means for diffracting the x-rays to provide an image, said means being placed along a second direction from the target; and a substrate, on which the image is formed, located along the second direction from the diffracting means wherein the substrate has a surface on a side of the substrate facing the diffracting means, and wherein the means for diffracting is an opaque spheric section that has a solid circular cross-section which is perpendicular to an axial line that extends through the target and the substrate and wherein the image formed by the means for diffracting has a large depth of field.

21. An apparatus as claimed in claim 20, further comprising a photoresist layer on the surface of the substrate facing the diffracting means.

22. An apparatus as claimed in claim 21, further comprising means for focusing the electron beam located along the first direction from the means for generating an electron beam and between the means for generating an electron beam and the means for deflecting the electron beam.

23. An apparatus as claimed in claim 22, wherein the diameter of the spheric section is between 0.01 mm and 40 mm.

24. An apparatus as claimed in claim 23, wherein the spheric section is a sphere.

25. A method for making a lithographic mask, comprising the steps of:
generating an electron beam in a first direction;
deflecting the electron beam so that it scans a predetermined pattern;
impinging the electron beam onto a target to create x-rays in a second direction;
diffracting the x-rays around a diffractive imaging element to form an image;
impinging the diffractive x-rays onto a substrate; and
focusing the electron beam before the electron beam is deflected.

26. A method for making a lithographic mask, comprising the steps of:
generating an electron beam in a first direction;
deflecting the electron beam so that it scans a predetermined pattern;
impinging the electron beam onto a target to create x-rays in a second direction;
diffracting the x-rays around a diffractive imaging element to form an image; and
impinging the diffractive x-rays onto a substrate, wherein the diffracting is accomplished by an opaque spheric section that has a solid circular cross-section which is perpendicular to an axial line that extends from the target to the substrate wherein the diffracted x-rays provide an image with a large depth of field.

27. A method as claimed in claim 26, wherein the diameter of the spheric section is between 0.01 mm and 40 mm.

28. A method as claimed in claim 27, wherein the opaque spheric section is an opaque sphere.

29. A method as claimed in claim 28, further comprising the steps of:
applying a layer of photoresist to a surface of the substrate facing the diffractive imaging element; and
chemically etching the layer of photoresist.

* * * * *